United States Patent
Xu et al.

(10) Patent No.: US 9,922,248 B2
(45) Date of Patent: Mar. 20, 2018

(54) ASYNCHRONOUS ON-DIE EYE SCOPE

(71) Applicant: Intel Corporation, Santa Clara, CA (US)

(72) Inventors: Mingming Xu, Phoenix, AZ (US); Stefano Giaconi, Phoenix, AZ (US); Wei Wang, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 14/865,401

(22) Filed: Sep. 25, 2015

(65) Prior Publication Data

US 2017/0091516 A1    Mar. 30, 2017

(51) Int. Cl.
*H04L 27/14* (2006.01)
*G06K 9/00* (2006.01)
*G01R 13/02* (2006.01)

(52) U.S. Cl.
CPC .......... *G06K 9/0053* (2013.01); *G01R 13/02* (2013.01); *G06K 9/00503* (2013.01); *G06K 9/00557* (2013.01); *G06K 9/00604* (2013.01)

(58) Field of Classification Search
CPC ....... H04L 27/144; H04L 7/0331; H04L 7/07; H04Q 1/46; A61B 5/0006
USPC ................. 375/335, 224, 226, 376; 324/638
See application file for complete search history.

(56) References Cited

U.S. PATENT DOCUMENTS

| 7,869,544 B2 | 1/2011 | Sorna et al. |
| 2006/0139033 A1 | 6/2006 | Forey et al. |
| 2010/0046683 A1* | 2/2010 | Beukema ............. H04L 7/0062 375/355 |
| 2010/0329318 A1 | 12/2010 | Dai et al. |
| 2010/0329325 A1* | 12/2010 | Mobin ............. H04L 25/03343 375/232 |
| 2012/0069938 A1* | 3/2012 | Farjad-Rad .......... H04L 7/0037 375/340 |

FOREIGN PATENT DOCUMENTS

| EP | 0128804 B1 | 7/1988 |
| EP | 2290392 A1 | 3/2011 |
| WO | WO 2017/052930 | 3/2017 |

OTHER PUBLICATIONS

"International Application Serial No. PCT/US2016/048464, International Search Report dated Dec. 6, 2016", 3 pgs.
"International Application Serial No. PCT/US2016/048464, Written Opinion dated Dec. 6, 2016", 5 pgs.

* cited by examiner

*Primary Examiner* — Khai Tran
(74) *Attorney, Agent, or Firm* — Patent Capital Group

(57) ABSTRACT

Some embodiments include apparatuses and methods having a receiver unit included in a die and a measurement unit included in the die. The receiver unit includes a sampler to sample a first signal based on timing of a first clock signal to generate a second signal. The measurement unit is arranged to sample the first signal based on timing of a second clock signal to provide information for generation of a graph presenting an eye scan of the first signal. The second clock signal has a frequency asynchronous with a frequency of the first clock signal.

20 Claims, 9 Drawing Sheets

US 9,922,248 B2

ASYNCHRONOUS ON-DIE EYE SCOPE

TECHNICAL FIELD

Embodiments described herein pertain to electrical signal measurements. Some embodiments relate to electrical signal eye diagrams.

BACKGROUND

Many electronic devices or systems, such as computers, network devices, tablets, and cellular phones, have receivers to receive signals. Conventional techniques are available to measure the signals received in the receivers and then generate a graph based on the measurement. The graph may show waveforms (e.g., an eye scan) of the signals over a particular time interval. Such a graph may assist in the analysis to evaluate the quality of the signals. Based on the analysis, adjustments may be made to receiver in order to improve the operations of the receivers. As described in more detail below, in some conventional techniques, components for measuring signals in such receivers may consume a relatively higher power, occupy a larger device area, and increase cost.

DETAILED DESCRIPTION

Some conventional techniques for generating an eye scan of signals in electronic devices or systems are usually synchronous and may be based on clocking circuits such as a dedicated phase interpolator (PI) or delay locked loop (DLL). The inventive techniques described herein include an integrated on-die eye measurement unit for receivers. The eye measurement unit can sample signals in a receiver based on asynchronous clocking. The eye measurement unit can collect and store information from the sampling. The stored information can be used to generate an eye scan of the signals. The integrated on-die eye scan may be useful for post-silicon validation (e.g., checking the performance of the receiver), high volume manufacturing (HVM), and product release qualification (PRQ). The techniques described herein involve relatively low frequency circuitry, which may lead to a relatively lower power consumption, smaller device area, and reduced cost. Moreover, components in the eye measurement unit used in the techniques described herein may be shared with other units in the device or in the system. Therefore, further reduction in cost may be achieved.

Figure 1:
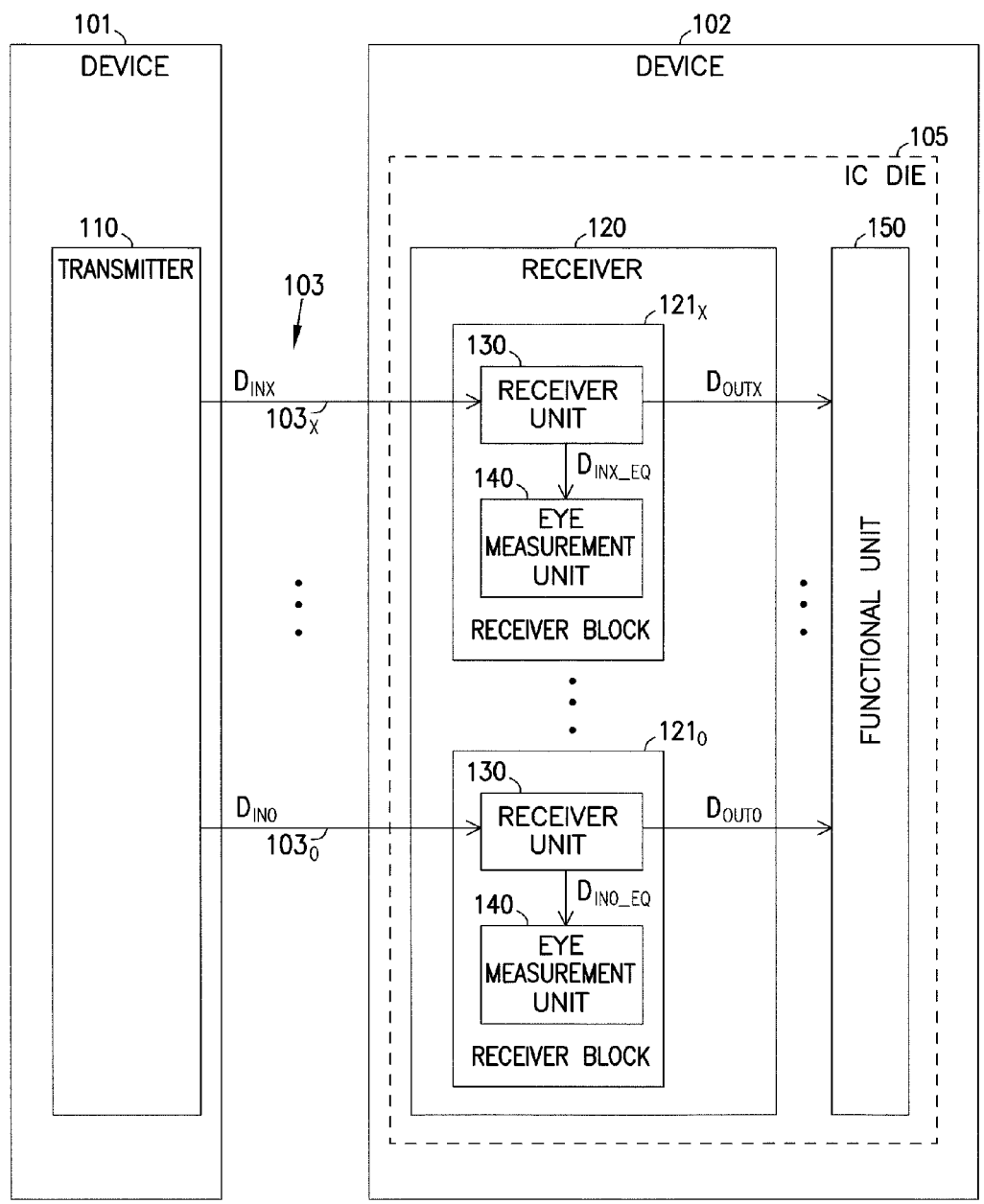
FIG. 1 shows an apparatus including devices and a channel between the devices, according to some embodiments described herein.

FIG. 1 shows an apparatus 100 including devices 101 and 102, and a channel 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems. Device 101 can include or be included in (e.g., formed in or formed on) an integrated circuit (IC) die (e.g., semiconductor die or an IC chip) 105. Device 102 can include or be included in (e.g., formed in or formed on) an IC die that can be different from IC die 105 or the same as IC die 105. Apparatus 100 can include or be included in a system-on-chip (SoC), such that device 101, 102, or both can be included (e.g., integrated) in the SoC.

Devices 101 and 102 can include controllers (e.g., processors, input/output controllers, memory devices, or other electronic devices). As shown in FIG. 1, devices 101 and 102 can include a transmitter 110 and a receiver 120, respectively.

Channel 103 can include links $103_0$ through $103_X$ to conduct signals between devices 101 and 102. For example, devices 101 and 102 may be included in different IC dice on a circuit board (e.g., printed circuit board), such that each of links $103_0$ through $103_X$ can include electrical conductive lines (e.g., metal-based traces) on the circuit board. Devices 101 and 102 can communicate with each other by providing signals on links $103_0$ through $103_X$. Alternatively, devices 101 and 102 may wirelessly communicate with each other, such that receiver 120 may receive signals $D_{IN0}$ through $D_{INX}$ from transmitter through wireless media (e.g., air) instead of through conductive lines. Devices 101 and 102 may communicate with each other using signals at a relatively high frequency (up to 32 GHz (gigahertz) or higher per link).

As shown in FIG. 1, transmitter 110 may transmit signals $D_{IN0}$ through $D_{INX}$ to receiver 120 on links $103_0$ through $103_X$, respectively. Each of signals $D_{IN0}$ through $D_{INX}$ can include a single-ended signal or a differential signal. Thus, each of links $103_0$ through $103_X$ can include a single electrical conductive line (e.g., to conduct a single-ended signal) or a pair of electrical conductive lines (e.g., to conduct a pair of different signals).

Receiver 120 can generate signals $D_{OUT0}$ through $D_{OUTX}$. A functional unit 150 of device 102 may receive signals $D_{OUT0}$ through $D_{OUTX}$ for further processing. Examples of functional unit 150 include part of a processing core (e.g., central processing unit (CPU)), part of a memory unit, or other types of functional units.

Receiver 120 can include receiver blocks $121_0$ through $121_X$ to receive signals $D_{IN0}$ through $D_{INX}$, respectively. Receiver block $121_0$ can generate signal (e.g., output signal) $D_{OUT0}$ based on signal (e.g., input signal) $D_{IN0}$. Receiver block $121_X$ can generate signal (e.g., output signal) $D_{OUTX}$ based on signal (e.g., input signal) $D_{INX}$. FIG. 1 shows an example where receiver 120 includes two receiver blocks. The number receiver blocks in receiver 120 may vary.

As shown in FIG. 1, each of receiver blocks $121_0$ through $121_X$ can include a receiver unit 130 and an eye measurement unit 140. Receiver unit 130 of receiver block $121_0$ can operate to receive signal $D_{IN0}$, perform an equalization operation on signal $D_{IN0}$ to generate a signal (e.g., equalized signal) $D_{IN0\_EQ}$, and generate signal $D_{OUT0}$ based on signal $D_{IN0\_EQ}$. Eye measurement unit 140 of receiver block $121_0$ can operate to generate a graph that represents an eye scan (e.g., eye diagram) of signal $D_{IN0\_EQ}$.

Receiver unit 130 of receiver block $121_X$ can operate to receive signal $D_{INX}$, perform an equalization operation on signal $D_{INX}$ to generate a signal (e.g., equalized signal) $D_{INX\_EQ}$, and generate signal $D_{OUTX}$ based on signal $D_{INX\_EQ}$. Eye measurement unit 140 of receiver block 121x can operate to generate a graph that represents an eye scan (e.g., eye diagram) of signal $D_{INX\_EQ}$.

Eye measurement unit 140 of each of receiver blocks $121_0$ through $121_X$ can have its own components. Alternatively, eye measurement unit 140 of one receiver block (e.g. $121_0$) may share components with eye measurement unit 140 of another receiver block (e.g. $121_X$) or share components with other units in device 102.

Each of receiver blocks $121_0$ through $121_X$ can include the receiver blocks described below with reference to FIG. 2 through FIG. 9.

Figure 2:
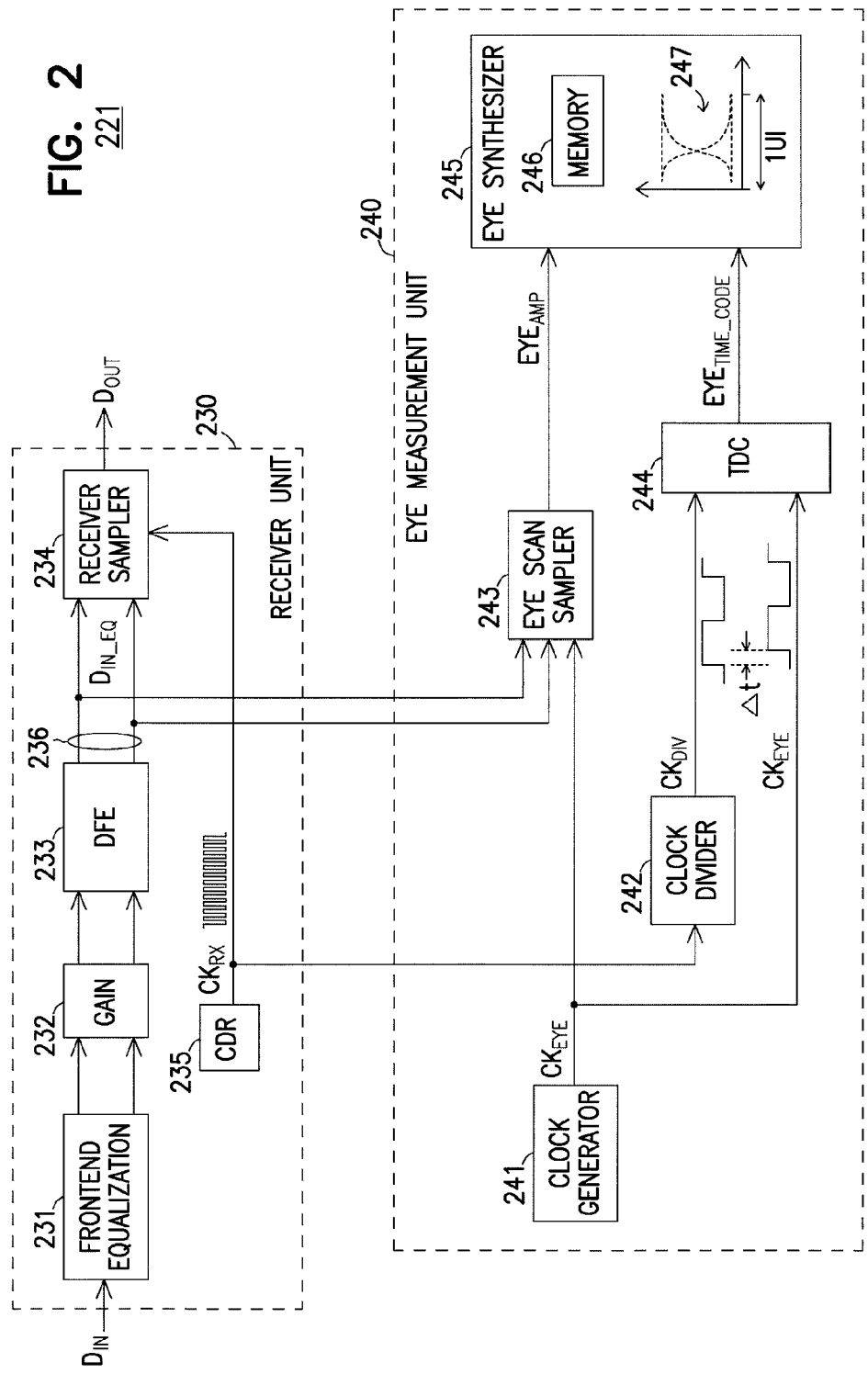
FIG. 2 shows a block diagram of a receiver block including a receiver unit and an eye measurement unit, according to some embodiments described herein.

FIG. 2 shows a block diagram of a receiver block 221 including a receiver unit 230 and an eye measurement unit 240, according to some embodiments described herein. Receiver block 221 can correspond to any of receiver blocks $121_0$ through $121_X$ of FIG. 1. Thus, receiver unit 230 and an eye measurement unit 240 of receiver block 221 of FIG. 2 can be included in (e.g., formed in or formed on) the same IC die (e.g., the IC die of FIG. 1).

As shown in FIG. 2, receiver unit 230 can receive a signal (e.g., input signal) $D_{IN}$, generate a signal (e.g., equalized signal) through $D_{IN\_EQ}$ based on signal $D_{IN}$, and generate signal $D_{OUT}$ (e.g., output signal) based on signal $D_{IN\_EQ}$. Receiver unit 230 may provide signal $D_{OUT}$ to another unit (e.g., functional unit 150 of FIG. 1) for further processing. Signals $D_{IN}$, $D_{IN\_EQ}$, and $D_{OUT}$ in FIG. 2 can correspond to signal $D_{IN0}$, $D_{IN0\_EQ}$, and $D_{OUT0}$, respectively (FIG. 1) or signals $D_{INX}$, $D_{INX\_EQ}$, and $D_{OUTX}$ (FIG. 1).

Receiver unit 230 can include a frontend equalizer 231, a gain stage 232, a decision-feedback equalizer (DFE) 233, a receiver sampler 234, and a clock and data recovery (CDR) circuit 235. Frontend equalizer 231 can include a feed forward equalizer (FFE), a continuous time linear equalizer (CTLE), or both. Gain stage 232 can include a variable-gain amplifier (VGA). Frontend equalizer 231, gain stage 232, and DFE 233 may form part of an equalization circuit that can perform an equalization operation to equalize interference that may occur in signal $D_{IN}$ in order to improve the quality of signal $D_{IN}$. The interference may include inter symbol interference (ISI) from a channel (e.g., channel 103 in FIG. 1) that conducts signal $D_{IN}$. Signal $D_{IN\_EQ}$ generated by DFE 233 may represent signal $D_{IN}$ after the equalization operation. Signal $D_{IN\_EQ}$ can be a relatively small signal (e.g., the signal can have a relatively small amplitude value).

Receiver sampler 234 can operate to sample signal $D_{IN\_EQ}$ provided at output 236 of DFE 233 to generate signal $D_{OUT}$. Signal $D_{OUT}$ can be a digital signal (e.g., having rail-to-rail voltage levels). Signal $D_{OUT}$ can include data information (e.g., binary 0 and 1 bits). Signal $D_{OUT}$ can also include any combination of data, phase, and error information.

Receiver sampler 234 may sample signal $D_{IN\_EQ}$ based on timing of a clock signal (e.g., main clock signal) $CK_{RX}$. The timing (e.g., the phase) of clock signal $CK_{RX}$ may be adjusted by CDR 235 based on detection and feedback loop (not shown) in receiver unit 230. The frequency of clock signal $CK_{RX}$ can be up to the GHz range (e.g., up to 32 GHz or higher).

Eye measurement unit 240 can include a clock generator 241, a clock divider 242, an eye scan sampler 243, a time-to-digital converter (TDC) 244, and an eye synthesizer 245. Eye measurement unit 240 can operate to sample signal $D_{IN\_EQ}$ to generate many sampling points. Each of the sampling points can be associated with information that includes two values: an amplitude value (e.g., a value corresponding to a position on a vertical axis) and a time code value (e.g., a value corresponding to a position on a horizontal axis). The amplitude values can be obtained based on information $EYE_{AMP}$ generated by eye scan sampler 243. The time code values can be obtained based on information $EYE_{TIME\_CODE}$ generated by TDC 244. The values of the sampling points can be stored in memory 246 and then can be used to generate a graph 247 that represents an eye scan of signal $D_{IN0\_EQ}$.

The eye scan generated by eye measurement unit 240 may allow for checking the performance of the receiver unit 230. For example, the eye scan may allow for checking of whether the gain of gain stage 232 is sufficient, whether the bandwidth and the timing of frontend equalizer 231 (e.g., the FFE, CTLE, or both) meets decision timing constraint of DFE 233, and other operational parameters of receiver unit 230.

Some of the components of eye measurement unit 240 of receiver block 221 may be shared with other receiver blocks (not shown in FIG. 2) or other units of a device that includes receiver block 221. For example, receiver block 221 can be included in device 102 (FIG. 1), such that receiver block 221 can share components with at least one of other units in device 102.

Clock generator 241 of eye measurement unit 240 can operate to generate a clock signal $CK_{EYE}$ independent of (e.g., not based on) clock signal $CK_{RX}$. Clock signal $CK_{EYE}$ can be a relatively low jitter clock signal. The frequency or phase (or both) of clock signal $CK_{EYE}$ is asynchronous (not synchronized) with the frequency of clock signal $CK_{RX}$. Hence, clock generator 241 can be referred to as an asynchronous clock generator relative to the phase and frequency of $CK_{RX}$. Clock signal $CK_{EYE}$ has a frequency lower than the frequency of clock signal $CK_{RX}$. This may allow eye measurement unit 240 to sample signal $D_{IN\_EQ}$ at a lower sampling frequency relative to the sampling frequency of receiver unit 230 that samples signal $D_{IN\_EQ}$ based on the timing of clock signal $CK_{RX}$. As an example, clock signal $CK_{EYE}$ may have a frequency in the MHz (megahertz) range (e.g., in the hundreds of MHz range) whereas the clock signal $CK_{RX}$ may have a frequency in the GHz range.

Clock generator 241 can include an oscillator to generate clock signal $CK_{EYE}$. The oscillator can be a crystal oscillator, such that clock signal $CK_{EYE}$ may be an independent clock signal (e.g., a reference clock signal) provided at the output of the crystal oscillator. Alternatively, the oscillator included in clock generator 241 can include an inverter-based ring oscillator to generate clock signal $CK_{EYE}$.

Clock divider 242 can operate to divide clock signal $CK_{EYE}$ to generate a clock signal $CK_{DIV}$. Thus, the frequency of clock signal $CK_{DIV}$ is less than the frequency of the $CK_{RX}$ signal. For example, the relationship between the frequency f1 of clock signal $CK_{RX}$ and the frequency f2 of clock signal $CK_{DIV}$ can be expressed as f2=f1/N, where N is greater than one. Thus, N=f1/f2 is the ratio of the frequency of clock signal $CK_{RX}$ over the frequency of clock signal $CK_{DIV}$. N can be programmable, such that value of N can be selected to determine the relationship between clock signals $CK_{RX}$ and $CK_{DIV}$.

The lower frequency of clock signal $CK_{DIV}$ allows TDC 244 to operate at low clock frequency. This may save power. The frequency f3 of clock signal $CK_{EYE}$ (generated by clock generator 241) can be equal to or less than the frequency of clock signal $CK_{DIV}$. Since clock signal $CK_{DIV}$ is generated based on clock signal $CK_{RX}$, the frequency of clock signal $CK_{EYE}$ can also be asynchronous (not synchronized) with the frequency of clock signal $CK_{DIV}$. Clock generator 241 can also generate clock signal $CK_{EYE}$ independent of (e.g., not based on) clock signal $CK_{DIV}$. The relationship between the frequency f3 of clock signal $CK_{EYE}$ and the frequency f2 of clock signal $CK_{DIV}$ can be expressed as f3=f2/n, where n can be equal to or greater than one and can be programmable. Thus the value of n can be selected to determine the relationship between clock signals $CK_{DIV}$ and $CK_{EYE}$.

Eye scan sampler 243 can sample signal $D_{IN\_EQ}$ at many sampling points based on timing (e.g., the rising edges) of clock signal $CK_{EYE}$ and generate information $EYE_{AMP}$ based in the sampling. Each sampling point can be associated with information that includes an amplitude value (e.g., voltage position value) and a time code value (e.g., timing position value). The amplitude value of a particular sampling point can be based on information $EYE_{AMP}$, which can be based on a value (e.g., voltage value) of the amplitude of signal $D_{IN\_EQ}$ when that particular sampling point is sampled. The time code value of each sampling point is provided by information $EYE_{TIME\_CODE}$ from TDC 244 (described below).

Eye scan sampler 243 can include an error sampler with a relatively high sensitivity and high resolution. Eye scan sampler 243 can include circuitry (not shown) such as a strong-arm flip-flop, a common mode logic flip-flop (CML-FF), or other type of flip-flop. Such circuitry can generate output information (e.g., $EYE_{AMP}$) based on input data information (e.g., based on signal $D_{IN\_EQ}$) and reference voltage information. Each of the input data information and the reference voltage information can include a single ended signal or differential signals.

TDC 244 can operate to convert a timing difference (e.g., Δt in FIG. 2) between clock signals $CK_{EYE}$ and $CK_{DIV}$ into a time code value, which is a digital code (e.g., a combination of bits). Information $EYE_{TIME\_CODE}$ generated by TDC 244 can include a time code value associated with each sampling point. The time code value associated with a particular sampling point can be based on a timing between clock signals $CK_{EYE}$ and $CK_{DIV}$ when that particular sampling point is sampled. The timing difference can be calculated based on an offset between the edges (e.g., rising edges) of clock signals $CK_{EYE}$ and $CK_{DIV}$. Depending on the resolution (e.g., accuracy) of TDC 244, the implementation of TDC 244 can vary.

Eye synthesizer 245 can generate graph 247 based on the information that includes amplitude values and time code values (stored in memory 246) associated with the sampling points. Graph 247 can include sampling points that represent an eye scan (e.g., full eye scan) for one unit interval of signal $D_{IN\_EQ}$. FIG. 2 shows memory 246 located at eye synthesizer 245 as an example. Memory 246 can be located in another location (e.g., another location in receiver block 221).

Figure 3:
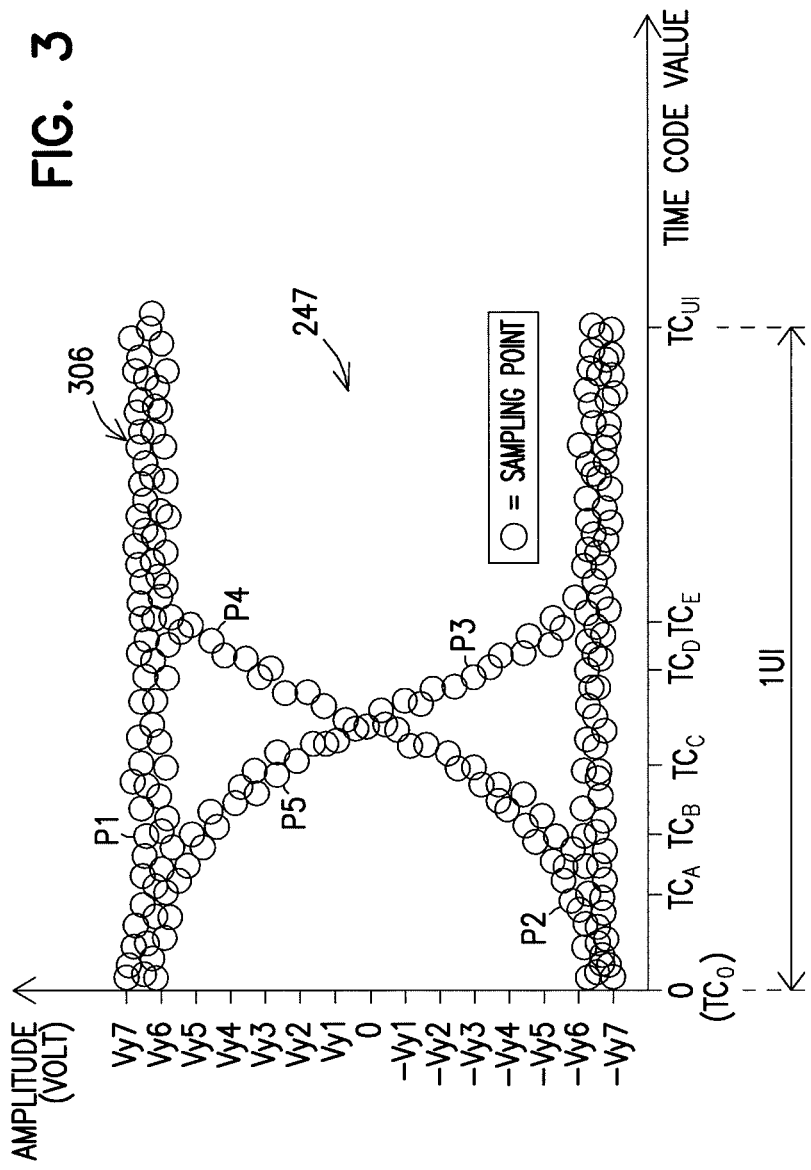
FIG. 3 shows a graph including sampling points generated by the eye measurement unit of FIG. 2, according to some embodiments described herein.

FIG. 3 shows graph 247 of FIG. 2 including example sampling points 306, according to some embodiments described herein. For simplicity, only five sampling points (e.g., P1, P2, P3, P4, and P5) among sampling points 306 are labeled. Sampling points 306 can be collected based on sampling of signal $D_{IN\_EQ}$ by eye measurement unit 240 of (FIG. 2). The number of sampling points 306 to generate an eye scan (shown in FIG. 3) can be programmable. Thus, depending on operation conditions and other parameters of receiver block 221 (FIG. 2) an appropriate number of number of sampling points 306 can be can be collected to generate graph 247 that presents an eye scan for one unit interval of signal $D_{IN\_EQ}$.

FIG. 3 shows a vertical axis for amplitude values and a horizontal axis for time code values. The amplitude values can include voltage values (e.g., in volt unit). The time code values can include digital values. FIG. 3 shows an example of a range of amplitude values −Vy7 through +Vy7, which can correspond to (e.g., can be based on) the range of amplitude values (e.g., minimum and maximum amplitude values) of signal $D_{IN\_EQ}$. FIG. 3 shows time code value 0 to time code value $TC_{UI}$ for a unit interval (UI), for example, one UI associated with signal $D_{IN\_EQ}$ in FIG. 2. In FIG. 3, time code values 0 to $TC_{UI}$ can be based on a time code range generated by TDC 244 (FIG. 2). In FIG. 3, $TC_A$, $TC_B$, $TC_C$, $TC_D$, and $TC_E$ are some example time code values between time code values 0 and $TC_{UI}$.

Each of the sampling points 306 in FIG. 3 can have coordinates (vertical and horizontal positions) based on an amplitude value and a time code value. For example, sampling point P1 can have coordinates corresponding to amplitude value Vy7 and time code value $TC_B$. Sampling point P2 can have coordinates corresponding to amplitude value −Vy6 and time code value $TC_A$. Sampling point P3 can have coordinates corresponding to amplitude value −Vy3 and time code value $TC_D$. Sampling point P4 can have coordinates corresponding to amplitude value Vy5 and time code value $TC_E$. Sampling point P5 can have coordinates corresponding to amplitude value Vy3 and time code value $TC_C$. The time code values $TC_A$, $TC_B$, $TC_C$, $TC_D$, and $TC_E$ can be provided by TDC 244 based on timing difference between clock signals $CK_{DIV}$ and $CK_{EYE}$ when points P1, P2, P3, P4, and P5, respectively, are sampled.

Figure 4:
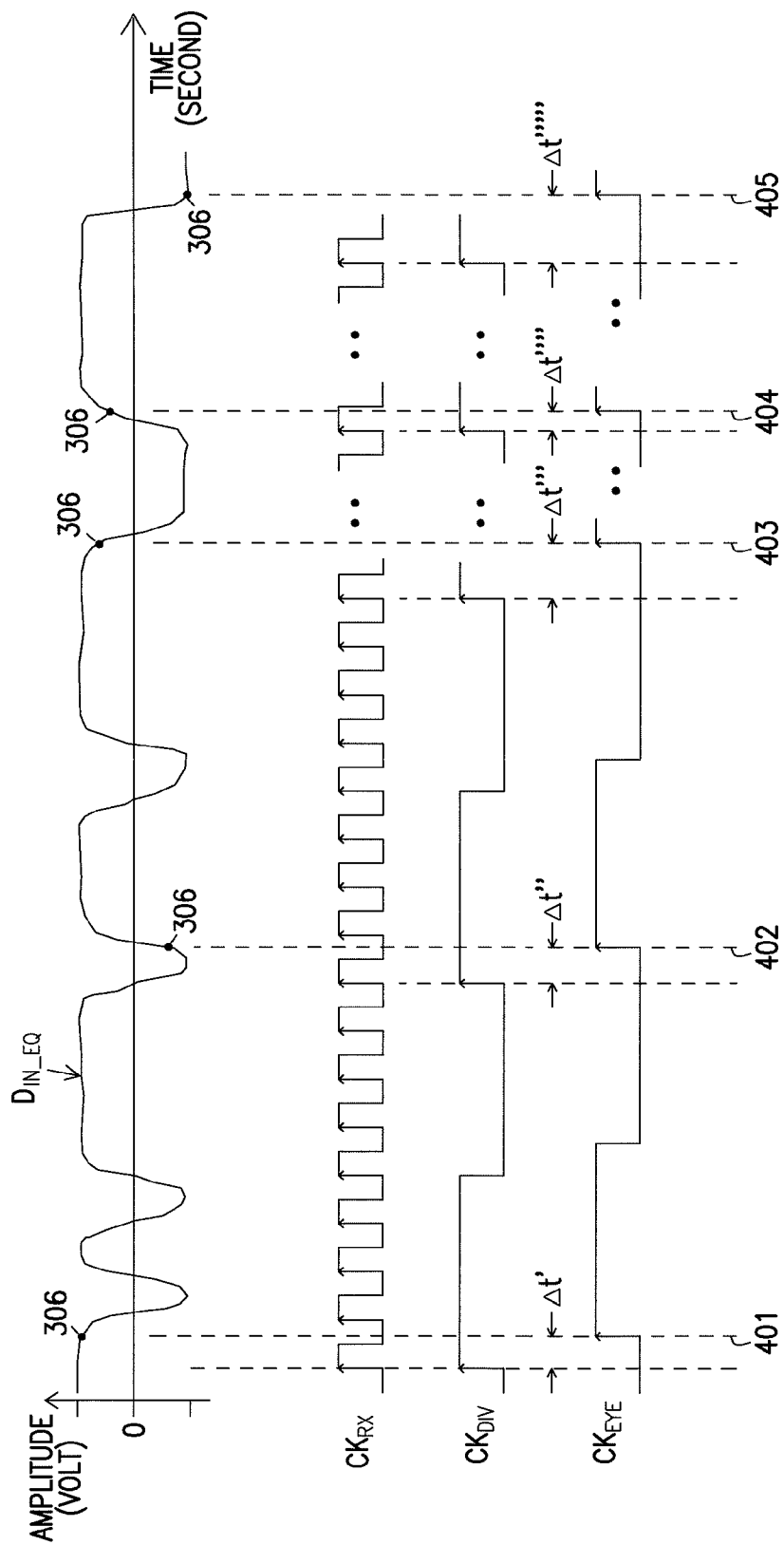
FIG. 4 shows example timing diagrams for clock signals of FIG. 2, according to some embodiments described herein.

FIG. 4 shows example timing diagrams for clock signals $CK_{RX}$, $CK_{DIV}$, and $CK_{EYE}$ of FIG. 2, according to some embodiments described herein. As shown in FIG. 4, clock signal $CK_{DIV}$ can be a divided form of (e.g., generated from) clock signal $CK_{RX}$. FIG. 4 shows an example where ratio of the frequency f1 of clock signal $CK_{RX}$ over the frequency f2 of clock signal $CK_{DIV}$ is N=8. The value of ratio N may vary. However, there is a trade-off between power and resolution of eye measurement unit 240. For example, a larger value for ratio N may result in TDC 244 operating at a lower clock frequency and may result in lower horizontal resolution for the eye scan. The horizontal resolution of eye measurement unit 240 can be defined as follows.

$$\text{Horizontal\_Resolution} = (UI*N)/2^M \qquad (1)$$

In expression (1), M is the resolution of TDC 244 (which includes a number of bits at the output TDC 244), and UI is the value of each unit interval associated with signal $D_{IN\_EQ}$. For example, if the frequency f1 of clock signal $CK_{RX}$ is 8 GHz, then UI=125 ps. In this example, if M=8, to achieve horizontal resolution of 2 ps, then the highest value for ratio N is approximately four (based on expression (1) above. In another example, if M=9, then the highest value for N can go up to 8.

As shown in FIG. 4, the frequency of clock signal $CK_{EYE}$ is asynchronous with the frequency of clock signal $CK_{DIV}$. For example, at times 401, 402, 403, 404, and 405, the timing differences (e.g., offsets) between clock signals $CK_{DIV}$ and $CK_{EYE}$ can be $\Delta t'$, $\Delta t''$, $\Delta t'''$, $\Delta t''''$, and $\Delta t'''''$, respectively. The values of timing differences $\Delta t'$, $\Delta t''$, $\Delta t'''$, $\Delta t''''$, and $\Delta t'''''$ can be different among each other. FIG. 4 shows the timing difference between clock signals $CK_{DIV}$ and $CK_{EYE}$ are based on the rising edges of clock signals $CK_{DIV}$ and $CK_{EYE}$ as an example. However, the timing difference between clock signals $CK_{DIV}$ and $CK_{EYE}$ can be based on other reference relationships (e.g., the falling edges) of clock signals $CK_{DIV}$ and $CK_{EYE}$.

During sampling of signal $D_{IN\_EQ}$ by eye measurement unit 240, TDC 244 can convert each of timing differences $\Delta t'$, $\Delta t''$, $\Delta t'''$, $\Delta t''''$, and $\Delta t'''''$ into a time code value (digital code). The relationship between time code values and timing differences (e.g., $\Delta t'$, $\Delta t''$, $\Delta t'''$, $\Delta t''''$, and $\Delta t'''''$) between clock signals $CK_{DIV}$ and $CK_{EYE}$ is described below with reference to FIG. 5.

As shown in FIG. 4, signal $D_{IN\_EQ}$ can be sampled at sampling points 306 based on the frequency (e.g., rising edge) of clock signal $CK_{EYE}$ instead of the frequency of clock signal $CK_{RX}$. For example, sampling points 306 can be sampled based on the corresponding rising edges of clock signal $CK_{EYE}$ at times 401, 402, 403, 404, and 405. FIG. 4 shows an example where the frequency f3 of clock signal $CK_{EYE}$ can be equal to the frequency f2 of clock signal $CK_{DIV}$ (e.g., f3=f2/n, where n=1), such that a maximum of one sampling point may be taken within one period of $CK_{DIV}$. However, the frequency f3 of clock signal $CK_{EYE}$ may be set (by changing the value of n, which is programmable) to be less than the frequency f2 of clock signal $CK_{DIV}$ (e.g., f3=f2/n, where n>1), such that a maximum of one sampling point may be taken within multiple (e.g., two or more) periods of clock signal $CK_{DIV}$.

As shown in FIG. 4, clock signal $CK_{EYE}$ is asynchronous with clock signal $CK_{DIV}$. Thus, some of sampling points 306 (in FIG. 3 and in FIG. 4) may have different amplitude values but may have the same time code value. Some other sampling points 306 may have the same amplitude value but may have different time code values. Some sampling points 306 may also have different amplitude values and different time code values.

Figure 5:
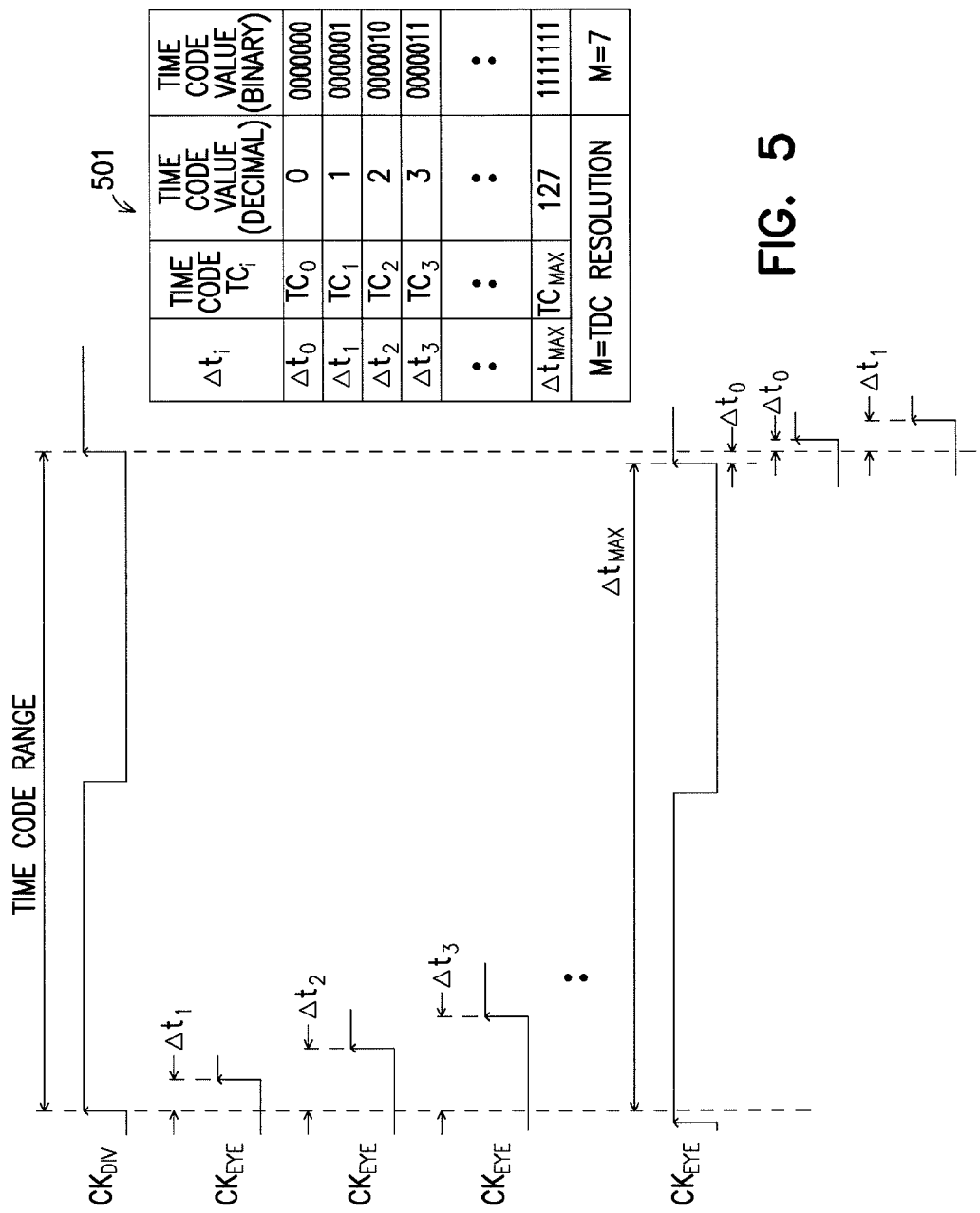
FIG. 5 shows example timing differences between two of the clock signals of FIG. 2 and time code values generated by a converter of the eye measurement unit of FIG. 2, according to some embodiments described herein.

FIG. 5 shows example timing differences between clock signals $CK_{DIV}$ and $CK_{EYE}$ of FIG. 2 and time code values generated by TDC 244 of FIG. 2, according to some embodiments described herein. In FIG. 5, a time code range can be measured between two consecutive rising edges of clock signal $CK_{DIV}$. The time code range includes the maximum number (quantity) of time code values that can be generated by TDC 244, depending on the resolution of TDC 244 (e.g., the maximum number of output bits that TDC 244 can generate at its output). For example, if M is the resolution of TDC 244, then TDC 244 can generate a maximum number of $2^M$ time code values (0 to $2^M-1$). As an example, if M=7, then the time code range can include time code values from 0 to 127 ($2^7-1$). This means that TDC 244 can generate 128 different combinations of 7 bits, in which each of the 128 combinations can represent one time code value.

As shown in FIG. 5, the time code range can be based on the period of clock signal $CK_{DIV}$. This means that $2^M$ time code values can be assigned to $2^M$ timing differences (e.g., from $\Delta t_0$ to $\Delta t_{MAX}$) between clock signals $CK_{DIV}$ and $CK_{EYE}$.

For example, as shown in chart 501 in FIG. 5, TDC 244 can generate time code value $TC_1$, $TC_2$, and $TC_3$, if the timing difference between clock signals $CK_{DIV}$ and $CK_{EYE}$ is $\Delta t_2$, $\Delta t_2$, and $\Delta t_3$, respectively. TDC 244 can generate other time code values of time code range based on other timing differences between clock signals $CK_{DIV}$ and $CK_{EYE}$. Time code value $TC_0$ can be zero if the timing difference between clock signals $CK_{DIV}$ and $CK_{EYE}$ is less than $\Delta t_1$. Time code value $TC_{MAX}$ is the maximum time code value among the $2^M$ time code values that can be generated by TDC 244. As shown in FIG. 5, time code value $TC_{MAX}$ can be generated when clock signals $CK_{DIV}$ and $CK_{EYE}$ have the greatest timing difference (e.g., $\Delta t_{MAX}$).

Thus, shown in FIG. 5, depending on the relative positions (e.g., the positions of the rising edges) between clock signals $CK_{DIV}$ and $CK_{EYE}$, TDC 244 can generate a corresponding time code value (e.g., one of $2^M$ time code values). As described above, eye measurement unit 240 can sample signal $D_{IN\_EQ}$ based on the rising edges of clock signal $CK_{EYE}$ to collect sampling points (e.g., sampling points 306 in FIG. 3). Thus, each of the sampling points can have a time code value generated based on the relative positions of clock signals $CK_{DIV}$ and $CK_{EYE}$, as shown in FIG. 5.

Figure 6:
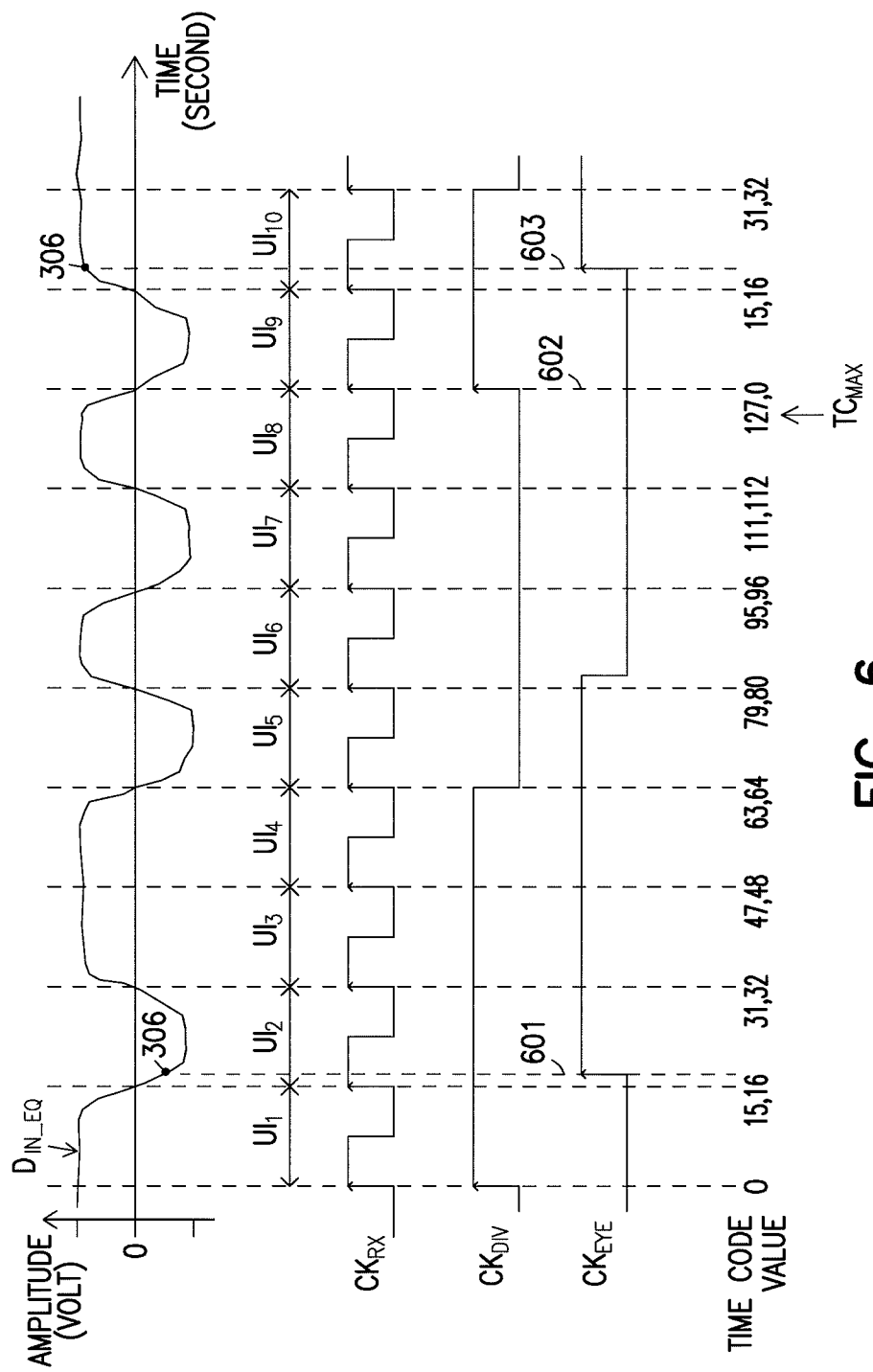
FIG. 6 shows relationships among timing of a data signal and clock signals, and time code values generated by a converter of the eye measurement unit of FIG. 2, according to some embodiments described herein.

FIG. 6 shows relationships among timing of signal $D_{IN\_EQ}$, clock signals $CK_{RX}$, $CK_{DIV}$, and $CK_{EYE}$, and time code values for an example M=7 of TDC 244 of FIG. 2, according to some embodiments described herein. FIG. 6 shows 10 unit intervals $UI_1$ to $UI_{10}$ of an example portion of signal $D_{IN\_EQ}$. Clock signal $CK_{RX}$ can have a period corresponding to one unit interval of signal $D_{IN\_EQ}$. Signal $D_{IN\_EQ}$ can provide one bit of information within each of the unit intervals $UI_1$ to $UI_{10}$. Clock signal $CK_{DIV}$ can have a period corresponding to N unit intervals. As described above, N is the ratio of the frequency f1 of clock signal $CK_{RX}$ over the frequency f2 of clock signal $CK_{DIV}$ (N=f1/f2). FIG. 6 shows an example of N=8. Thus, the period of clock signal $CK_{DIV}$ can correspond to eight unit intervals (e.g., $UI_1$ to $UI_8$).

In FIG. 6, the resolution M of TDC 244 (FIG. 2) is assumed to be seven (e.g., M=7). Thus, the time code range can include 128 time code values, from 0 to 127, where time code value 127 is the maximum time code value.

The time code range can be divided into time code subsets. Each of the time code subsets can have an equal number of S time code values among the total number of time code values of the time code range (S=$2^M$÷N).

Each of unit intervals (e.g., $UI_1$ to $UI_8$) within one period of clock signal $CK_{DIV}$ is associated with each time code subset. In the example of FIG. 6, since there are eight unit intervals (e.g., $UI_1$ to $UI_8$) within one period of signal $CK_{DIV}$, each of the eight unit intervals can be associated with an equal number of 16 time code values ($2^7$÷8=16). For example, as shown in FIG. 6, unit interval $UI_1$ can be associated with the time code subset having time code values 0 to 15. Unit interval $UI_2$ can be associated with the time code subset having time code values 16 to 31. Unit intervals $UI_3$ to $UI_8$ can be associated with other the time code subsets, as shown in FIG. 6. In the example of FIG. 6, since TDC 244 is an example of resolution M=7, time code value 127 can be the maximum time code value among $2^7$=128 time code values.

The time code range can be repeated for every consecutive subsequent rising edge to rising edge of clock signal $CK_{DIV}$. As shown in FIG. 6, from rising edge at time 602 to another rising edge (not shown) of clock signal $CK_{DIV}$, time code values 0 to 127 are repeated. For example, unit interval $UI_9$ has time code values 0 to 15, which is the same as the time code values for unit interval UI$_1$. Unit interval UI$_{10}$ has time code values 16 to 32, which is the same as the time code values for unit interval UI$_2$, and so on.

FIG. 6 shows example sampling points 306 sampled at times 601 and 603 (e.g., the rising edges of clock signal CK$_{EYE}$). Sampling points 306 in FIG. 6 can be two of sampling points 306 of FIG. 3. As shown in FIG. 6, although sampling points 306 are associated with unit intervals (e.g., UI$_2$ and UI$_{10}$) having the same time code subset (e.g., 16 to 31), sampling points 306 may have different time code values within the time code subset because clock signal CK$_{EYE}$ is asynchronous with clock signal CK$_{DIV}$. Thus, given enough sampling time, the rising edge of clock signal CK$_{EYE}$ may be at positions associated with all of the time code values 16 to 31 during sampling of different sampling points of the unit interval associated with time code values 16 to 31. Similarly, for other unit intervals associated with other time code subsets (e.g., 0 to 15, 32 to 47, etc.), given enough sampling time, the rising edge of clock signal CK$_{EYE}$ may be at positions associated with all of the time code values of other time code subsets. The sampling time can be selected and can be programmable, such that enough sampling points 306 can be collected in order to generate an eye scan by graph 247 (FIG. 3).

FIG. 6 shows an example where the rising edges of clock signal CK$_{RX}$ are edged aligned with an edge of a corresponding UI. However, the rising edges of clock signal CK$_{RX}$ can be aligned with another portion (e.g., the center) of a corresponding UI.

In order to form a full eye scan within a single UI, the sampling points associated with time code subsets can be aligned among each other based on the their time code values.

Thus, although sampling of signal D$_{IN\_EQ}$ is based on the frequency of clock signal CK$_{EYE}$, given enough sampling time to collect enough sampling points 306 associated with different amplitude values and time code values, sampling points 306 may fill the entire unit interval to represent an eye scan of signal D$_{IN\_EQ}$.

Figures 7A, 7B:
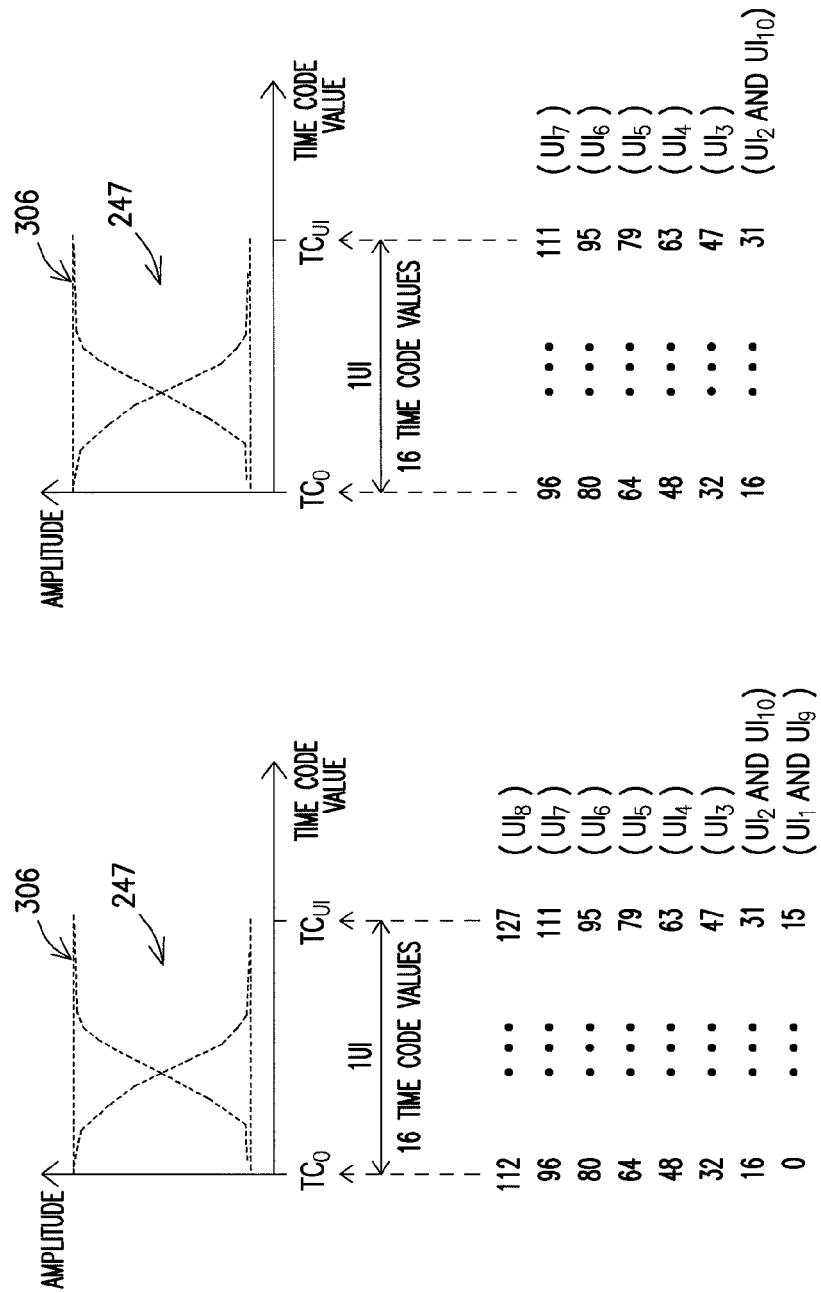
FIG. 7A shows an alignment of time code values to one unit interval, according to some embodiments described herein.
FIG. 7B shows an alignment of time code values to one unit interval where some of the time code values are omitted, according to some embodiments described herein.

FIG. 7A shows an alignment of the time code values of FIG. 6 to one unit interval, according to some embodiments described herein. As shown in FIG. 7A, 16 time code values associated with each of unit intervals UI$_1$ to UI$_{10}$ can be aligned (e.g., mapped or "folded back") to the times code values from time code value TC$_0$ to time code value TC$_{UI}$ (16 time codes) on the horizontal axis of graph 247. In FIG. 7A, time code value TC$_{UI}$ can be calculated as follows.

$$TC_{UI}=[(TC_{HIGHEST}+1)/N]-1 \quad (2)$$

In equation (2), TC$_{HIGHEST}$ is the highest time code value among the time code values stored in memory 246 (FIG. 2), and N=f1/f2, which is the ratio of the frequency of clock signal CK$_{RX}$ over the frequency of clock signal CK$_{DIV}$.

A modulo (mod) operation can be performed to align (e.g., map) each of the time code values of the time code range to a corresponding position associated with one UI on the horizontal axis. The position H(TC$_i$) on the horizontal axis of a particular sampling point associated with a time code value (TC$_i$) can be expressed as H(TC$_i$)=TC$_i$ modulo ($2^M$/N), where TC$_i$ the time code value associated with the particular sampling point. For example, time code value 16 can be aligned to position 0 because H(TC$_{16}$)=16 modulo 16=0. Time code value 17 can be aligned to position 1 because H(TC$_{17}$)=17 modulo 16=1. Time code value 18 can be aligned to position 2 because H(TC$_{18}$)=18 modulo 16=2. Time code value 47 can be aligned to position 15 because H(TC$_{47}$)=15 modulo 16=15. Similarly, the modulo operation can be performed on each of the other time code values in other to appropriately align them to one of the positions 0 to 15 on the horizontal axis.

As shown in FIG. 7A, time code value 127 can be aligned to position H(TC$_{127}$)=127 modulo 16=15. Thus, the maximum time code value (e.g., 127 in this example) of a time code range (from 0 to 127) may be different from the time code value TC$_{UI}$ on the horizontal axis of graph 247.

FIG. 7A shows an example where time code values associated with all of the unit intervals (e.g., UI$_1$ to UI$_8$) within one period of clock signal CK$_{DIV}$ (FIG. 6) are used for alignment to generate graph 247. However, in order to improve accuracy in presenting the eye scan of signal D$_{IN\_EQ}$ and to avoid nonlinearity impacts (e.g., clock charge injection and cross-talks), time code values associated with unit intervals at the edges of clock signal CK$_{DIV}$ can be omitted from the alignment of time code values (used to generate graph 247) shown in FIG. 7A. For example, as shown in FIG. 6, unit intervals UI$_1$ and UI$_8$ are at the edges of clock signal CK$_{DIV}$. Thus, in this example, time code values 0 to 15 (associated with UI$_1$) and 112 to 127 (associated with UI$_8$) can be omitted. Similarly, time code values 0 to 15 (associated with UI$_9$) can also be omitted. Thus, sampling points associated with time code values 0 to 15 and 112 to 127 can be omitted from graph 247.

FIG. 7B shows an alignment of time code values of FIG. 6 to one unit interval where some of time code values are omitted, according to some embodiments described herein. For example, as described above, time code values 0 to 15 (associated with UI$_1$ in FIG. 6) and time code values 112 to 127 (associated with UI$_8$ in FIG. 6) can be omitted. Thus, in the example of FIG. 7B, fewer than all of the time code values (in this example, fewer than all of time code values from 0 to 127) in the time code range in FIG. 6 are used for alignment in one UI represented by graph 247. For example, in FIG. 7B, only time code value 16 to 111 are aligned within one unit interval.

As described above with reference to FIG. 2 through FIG. 7B, a horizontal position of each of the sampling points (e.g., each of the sampling points 306 in FIG. 3 of graph 247) can be based on timing code values generated based on timing difference between signals CK$_{DIV}$ and CK$_{EYE}$. A vertical position from 0 to +Vy7 and from 0 to −Vy7 of each of the sampling points (e.g., each of the sampling points 306 in FIG. 3 of graph 247) can be calculated based on the resolution of a reference voltage and the sensitivity of the eye scan sampler 243. An example calculation for a vertical position of each of the sampling points follows.

For example, the vertical axis of graph 247 (FIG. 3) can be divided into divisions (e.g., portions). Each division can have a relatively small voltage value (e.g., a few millivolts or other values). The number of sampling points (e.g., some of the sampling points 306) in a particular division between 0 and +Vy7 at a particular time code value (e.g., one of time code values 0 to 127 in FIG. 6) can be determined (e.g., calculated) as in the following example.

For a particular division between 0 and +Vy7, a positive initial reference voltage (e.g., 2 mV) can be applied to the circuitry (e.g., strong-arm flip-flop) in eye scan sampler 243 in an initial sampling. Then, signal D$_{IN\_EQ}$ can be sampled for an amount of time (e.g., one or two seconds, or another amount of time). During the sampling, the number (quantity) of bits "1" (binary one) from information EYE$_{AMP}$ (FIG. 2) can be counted. Thus, each time code value (e.g., each of time code values 0 to 127) may have a number of bits "1" based on the initial positive initial reference voltage. The number of bits "1" associated with a particular time code value may be different from or the same as the number of bits "1" associated with another time code value, depending on the value of the signal $D_{IN\_EQ}$ at the position of that particular time code.

Then, in an additional sampling, a higher positive reference voltage (e.g., 4 mV) can be applied to the circuitry (e.g., strong-arm flip-flop) in eye scan sampler 243. Signal $D_{IN\_EQ}$ can be sampled again for an amount of time (e.g., another one or two seconds) within the additional sampling. During the additional sampling, the number (quantity) of bits "1" from information $EYE_{AMP}$ (FIG. 2) can be counted. Similar to the initial sampling, each time code value (e.g., each of time code values 0 to 127) may have a number of bits "1" based on the additional positive reference voltage.

Based on the number of bits "1" counted in two samplings (e.g., one with 2 mV and the other with 4 mV), the resulting number of sampling points in a particular division (e.g., the division between 2 mV and 4 mV on the vertical axis) at a particular time code value (e.g., one of 0 to 127) can be determined by calculating a difference in the counted number of bits "1" at that particular time code value. For example, at time code value 13 (one of the time code values among 0 to 127), if there are 950 bits "1" counted during the initial sampling and if there are 900 bits "1" counted during the additional sampling, then the sampling points in the division between 2 mV and 4 mV on the vertical axis at time code value 13 is 50. This number of sampling points (50) is the difference between 950 and 900 (950−900=50).

Similarly, the sampling points in the division between 2 mV and 4 mV on the vertical axis for each of the other time codes (e.g., 0 to 12 and 14 to 127) can be determined based on the counted number of bits "1" in the initial sampling when 2 mV is used for the reference voltage and the counted number of bits "1" at the particular time code value in the additional sampling when 4 mV was used for the reference voltage.

The number of sampling points (50) and their associated amplitude values (e.g., 2 mV) and time code value (e.g., 13) can be stored (e.g., stored in memory 246 of FIG. 2) and then can be used to generate an eye scan (e.g., graph 247 of FIG. 2) of signal $D_{IN\_EQ}$ (FIG. 2). In this example, 50 sampling points may be plotted on graph 247 at the vertical position corresponding to the division between 2 mV and 4 mV and at the horizontal position corresponding to time code value 13.

The example above describes determining the number of sampling points at each of the time code values in the time code value range (e.g., 0 to 127) for only one division between 0 and +Vy7 on the vertical axis of graph 247. For each of the divisions between 0 and +Vy7 on the vertical axis of graph 247, determining the number of sampling points can be performed in a similar manner but with different values (e.g., values up to +Vy7) for the reference voltage for different divisions. For example, voltage values in an increasing order (e.g., 6 mV, 8 mV, 10 mV, and so on, up to +Vy7) may be used in determining the number of sampling points at each of the time code values in the time code value range (e.g., 0 to 127) for all of the divisions between 0 and +Vy7 on the vertical axis of graph 247.

The above example describes determining the sampling points for each of the divisions between 0 and +Vy7. For each of the divisions between 0 and −Vy7, determining the sampling points can be in a similar manner but with modification. For example, instead of increasing the values of the reference voltage for each division (e.g., from 2 mV to 4 mV) and counting bits "1", the values of the reference voltage for each division between 0 and −Vy7 can be decreased (e.g., from −2 mV down to −Vy7) and counting bits "0". Then, the number of sampling points in a particular division (e.g., the division between −2 mV and −4 mV on the vertical axis) at a particular time code value (e.g., one of 0 to 127) can be determined by calculating a difference in the number of bits "0" at the particular time code value that are counted in the two sampling operations for each division. For example, voltage values in an decreasing order (e.g., −2 mV, −4 mV, −6 mV, and so on, down to −Vy7) may be used in determining the number of sampling points at each of the time code values in the time code value range (e.g., 0 to 127) for all of the divisions between 0 and −Vy7 on the vertical axis of graph 247.

Thus, as described above with reference to FIG. 2 through FIG. 7B, the amplitude values and the time code values of sampling points (e.g., sampling points 306 in FIG. 3) of signal $D_{IN\_EQ}$ can be collected and stored. Then, a graph (e.g., graph 247 in FIG. 3) can be generated to represent an eye scan of a signal $D_{IN\_EQ}$.

Figure 8:
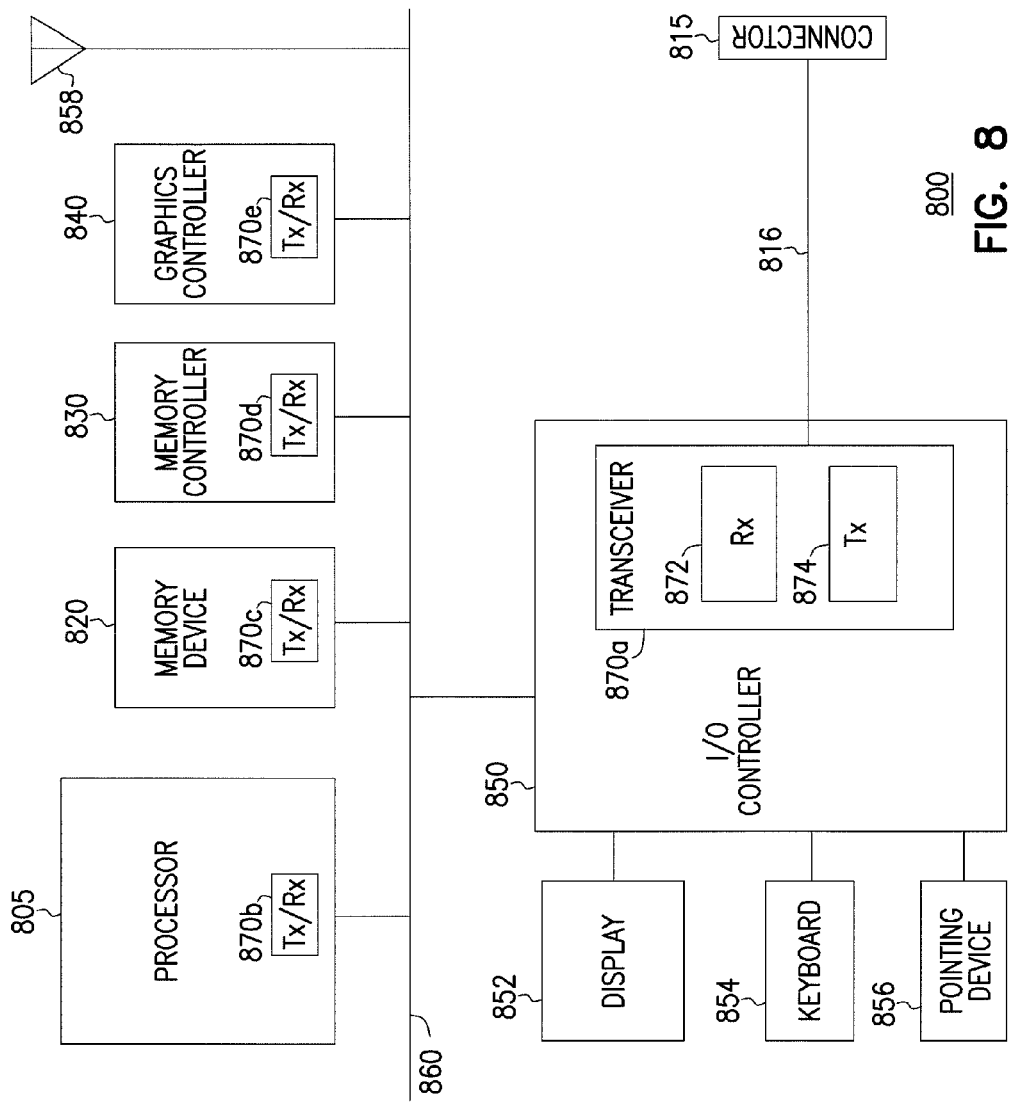
FIG. 8 shows an apparatus in the form of a system (e.g., electronic system), according to some embodiments described herein.

FIG. 8 shows an apparatus in the form of a system (e.g., electronic system) 800, according to some embodiments described herein. System 800 can include or be included in a computer, a tablet, or other electronic systems. As shown in FIG. 8, system 800 can include a processor 805, a memory device 820, a memory controller 830, a graphics controller 840, an input and output (I/O) controller 850, a display 852, a keyboard 854, a pointing device 856, at least one antenna 858, a connector 815, and a bus 860.

Each of processor 805, memory device 820, memory controller 830, graphics controller 840, and I/O controller 850 can include a device or be included in a device, such as device 101 or device 102 of FIG. 1.

In some arrangements, system 800 does not have to include a display. Thus, display 852 can be omitted from system 800. In some arrangements, system 800 does not have to include any antenna. Thus, antenna 858 can be omitted from system 800.

Processor 805 may include a general-purpose processor or an application-specific integrated circuit (ASIC).

Memory device 820 may include a dynamic random access memory (DRAM) device, a static random access memory (SRAM) device, a flash memory device, or a combination of these memory devices. FIG. 8 shows an example where memory device 820 is a stand-alone memory device separated from processor 805. In an alternative arrangement, memory device 820 and processor 805 can be located on the same IC die. In such an alternative arrangement, memory device 820 is an embedded memory in processor 805, such as embedded DRAM (eDRAM), embedded SRAM (eSRAM), embedded flash memory, or another type of embedded memory.

Display 852 can include a liquid crystal display (LCD), a touchscreen (e.g., capacitive or resistive touchscreen), or another type of display. Pointing device 856 can include a mouse, a stylus, or another type of pointing device.

I/O controller 850 can include a communication module for wired or wireless communication (e.g., communication through one or more antenna 858). Such wireless communication may include communication in accordance with WiFi communication technique, Long Term Evolution Advanced (LTE-A) communication technique, or other communication techniques.

I/O controller 850 can also include a module to allow system 800 to communicate with other devices or systems in accordance with one or more of the following standards or specifications (e.g., I/O standards or specifications), including Universal Serial Bus (USB), DisplayPort (DP), High- Definition Multimedia Interface (HDMI), Thunderbolt, Peripheral Component Interconnect Express (PCIe), and other specifications.

Connector 815 can be arranged (e.g., can include terminals, such as pins) to allow system 800 to be coupled to an external device (or system). This may allow system 800 to communicate (e.g., exchange information) with such a device (or system) through connector 815. Connector 815 may be coupled to I/O controller 850 through a connection 816 (e.g., a bus). Connector 815, connection 816, and at least a portion of bus 860 can include conductive lines that conform with at least one of USB, DP, HDMI, Thunderbolt, PCIe, and other specifications. In some arrangements, system 800 does not have to include connector 815 and connection 816. In such arrangements, I/O controller 850 may communicate with other devices or systems through wireless communication.

I/O controller 850 can include a transceiver (Tx/Rx) 870*a* having a receiver (Rx) 872 and a transmitter (Tx) 874. Transmitter 874 can operate to transmit information from I/O controller 850 to another part of system 800 or to an external device (or system) coupled to connector 815. Receiver 872 can operate to allow I/O controller 850 to receive information from another part of system 800 or from an external device (or system) coupled to connector 815. Receiver 872 can include any of the receivers described above with reference to FIG. 1 through FIG. 7B.

As shown in FIG. 8, processor 805, memory device 820, memory controller 830, and graphics controller 840 can include transceivers 870*b*, 870*c*, 870*d*, and 870*e*, respectively, to allow each of these components to transmit and receive information through their respective transceiver. At least one of transceivers 870*b*, 870*c*, 870*d*, and 870*e* can be similar to or identical to transceiver 870*a*. Thus, at least one of transceivers 870*b*, 870*c*, 870*d*, and 870*e* can include a receiver similar to or identical to receiver 872. For example, at least one of transceivers 870*a*, 870*b*, 870*c*, 870*d*, and 870*e* can include a receiver that can be arranged to allow at least one of processor 805, memory device 820, memory controller 830, and graphics controller 840 to receive information (e.g., signals) from another part of system 800 or from an external device (or system) coupled to connector 815.

FIG. 8 shows the components of system 800 arranged separately from each other as an example. For example, each of processor 805, memory device 820, memory controller 830, graphics controller 840, and I/O controller 850 can be located on a separate IC die. In some arrangements, two or more components (e.g., processor 805, memory device 820, graphics controller 840, and I/O controller 850) of system 800 can be located on the same IC die that may form or may be part of a system-on-chip.

Figure 9:
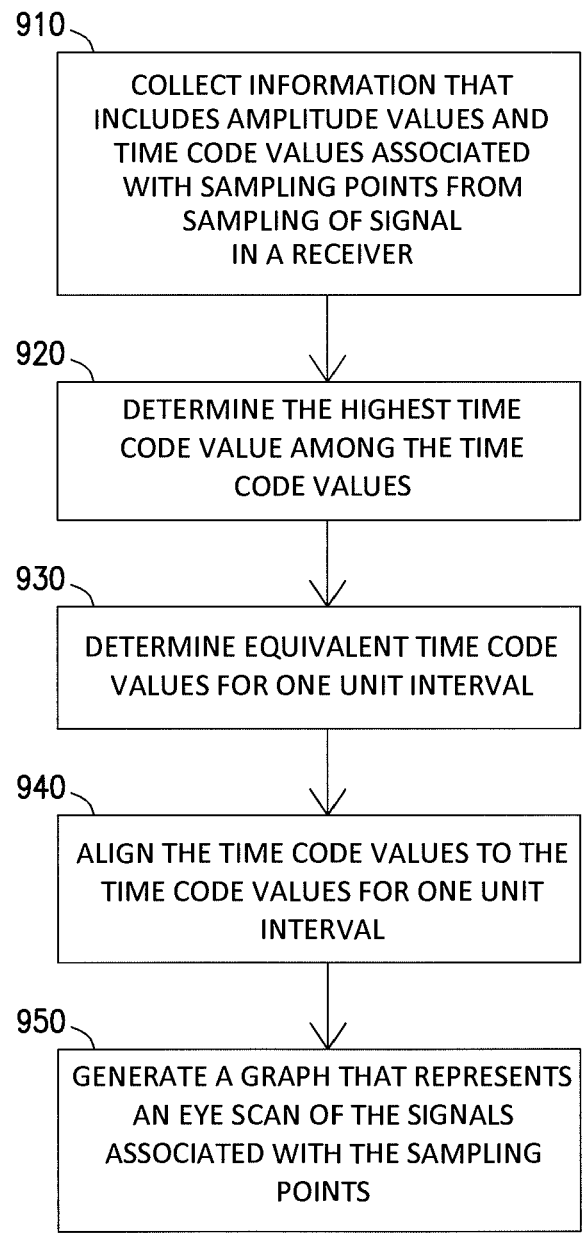
FIG. 9 is a flowchart showing a method of generating an eye scan of a signal, according to some embodiments described herein.

FIG. 9 is a flowchart showing a method 900 of generating an eye scan of a signal, according to some embodiments described herein. The signal in method 900 can be a signal in a receiver (e.g., signal $D_{IN\_EQ}$ described above with reference to FIG. 1 through FIG. 8). At least a portion of method 900 may be implemented by software, firmware, hardware or any combination of software, firmware, and hardware.

As shown in FIG. 9, activity 910 of method 900 can include collecting information that includes amplitude values and time code values associated with sampling points from sampling of signals in a receiver. The sampling can include activities and operations and can be performed by an eye measurement unit described above with reference to FIG. 1 through FIG. 8. Activity 910 in FIG. 9 can also include storing the information that includes the amplitude values and time code values in a memory (e.g., memory 246).

Activity 920 can include determining the highest time code value among the time code values (e.g., the time code values stored in the memory based on activity 910). Depending on the operating condition (e.g., operating temperature, operating voltage, or both) at the time of sampling to collect the amplitude values and the time code values, the highest time code value (stored in memory) may be different from the maximum time code value $TC_{MAX}$. In activity 920, as an example, if the time code values are from 0 to 127, then the highest time code value is 127. In another example, if the time code values are from 0 to 125, then the highest time code value is 125. Thus, in activity 920, determining the highest time code value among the time code values can include comparing the time code values among each other and then selecting the highest time code value based on the comparison.

Activity 930 can include determining equivalent time code values for one unit interval, which is the unit interval associated with the signal. The equivalent time code values for one unit interval can be time code value $TC_0$ through time code value $TC_{UI}$, where $TC_0$ can be 0 and $TC_{UI}$ can be calculated based on equation (2) above. Thus, in activity 930, determining the equivalent time code values for one unit interval can include performing a math calculation based on equation (2) to find the equivalent time code values for one unit interval.

Activity 940 can include aligning the time codes values to the time code values for one unit interval. Aligning the time codes values can include aligning fewer than all of the time code values to the time code values in one UI. Aligning fewer than all of the time code values can include similar activities and operation described above with reference to FIG. 7B. Alternatively, aligning the time codes values in activity 940 can include aligning all of the time code values to the time code values in one UI. Aligning all of the time code values can include similar activities and operations described above with reference to FIG. 7A.

Activity 950 of method 900 can include generating a graph that represents an eye scan of signals associated with the sampling points.

Method 900 can include fewer or more activities relative to activities 910, 920, 930, 940, and 950 shown in FIG. 9. For example, method 900 can include activities and operations of receiver unit 230 and eye measurement unit 240 described above with reference to FIG. 1 through FIG. 8.

The illustrations of apparatus (e.g., apparatus 100 and system 800) and methods (e.g., method 900, and operations of a receiver including operations of an eye measurement unit of the receiver described above with reference to FIG. 1 through FIG. 9) are intended to provide a general understanding of the structure of various embodiments and are not intended to provide a complete description of all the elements and features of apparatuses that might make use of the structures described herein.

The apparatus (e.g., apparatus 100 and system 800) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

ADDITIONAL NOTES AND EXAMPLES

Example 1 includes subject matter (such as a device, an electronic apparatus (e.g., circuit, electronic system, or both), or a machine) including a receiver unit included in a die, the receiver including a sampler to sample a first signal based on timing of a first clock signal to generate a second signal, and measurement unit included in the die to sample the first signal based on timing of a second clock signal to provide information for generation of a graph presenting an eye scan of the first signal, the second clock signal has a frequency asynchronous with a frequency of the first clock signal.

In Example 2, the subject matter of Example 1 may optionally include, wherein the frequency of the second clock signal is less than the frequency of the first clock signal.

In Example 3, the subject matter of Example 1 or 2 may optionally include, wherein the information includes time code values associated with positions on a horizontal axis of the graph.

In Example 4, the subject matter of Example 3 may optionally include, wherein the measurement unit is arranged to align fewer than all of the time code values to one unit interval associated with the signal.

In Example 5, the subject matter of Example 3 may optionally include, wherein the measurement unit is arranged to generate the time code values based on a timing relationship between the second clock signal and an additional clock signal generated based on the first clock signal, In Example 6, the subject matter of Example 1 or 2 may optionally include, wherein the information includes amplitude values associated with positions on a vertical axis of the graph.

In Example 7, the subject matter of Example 1 or 2 may optionally include, wherein the measurement unit includes a clock generator to generate the second clock signal independent of the first clock signal.

Example 8 includes subject matter (such as a device, an electronic apparatus (e.g., circuit, electronic system, or both), or a machine) including a first sampler to receive a first signal and generate a second signal based on timing of a first clock signal, a divider to generate a second clock signal from the first clock signal, a second sampler to sample the first signal at sampling points based on timing of a third clock signal asynchronous with the second clock signal and provide information associated with amplitude values of the sampling points, a converter to generate time code values associated with the sampling points based on a timing relationship between the second and third clock signals, and a memory to store the amplitude values and the time code values.

In Example 9, the subject matter of Example 8 may optionally include, wherein the first and second samplers are included in a receiver.

In Example 10, the subject matter of Example 8 may optionally include, further comprising an equalizer to generate the first signal.

In Example 11, the subject matter of any of Examples 8-10 may optionally include, wherein further comprising a clock and data recovery circuit to adjust the timing of the first clock signal, and a clock generator to generate the third clock signal.

In Example 12, the subject matter of Example 8 may optionally include, wherein the converter includes a time-to-digital converter to generate the time code values based on a timing difference between the second and third clock signals.

In Example 13, the subject matter of any of Examples 8-10 may optionally include, further comprising a synthesizer to generate a graph of the sampling points based on the amplitude values and the time code values.

In Example 14, the subject matter of Example 13 may optionally include, wherein the synthesizer is arranged to generate the graph from fewer than all of the sampling points.

In Example 15, the subject matter of any of Examples 8-10 may optionally include, wherein the second sampler is arranged to sample the first signal, such that a maximum of one sampling point is sampled within one period of the second clock signal.

In Example 16, the subject matter of any of Examples 8-10 may optionally include, further comprising the second sampler is arranged to sample the first signal, such that a maximum of one sampling point is sampled within multiple periods of the second clock signal.

Example 17 includes subject matter (such as a device, an electronic apparatus (e.g., circuit, electronic system, or both), or a machine) including conductive lines on a circuit board, and a receiver to receive signals from the conductive lines, the receiver including a receiver unit included in a die, the receiver including a sampler to sample a first signal based on timing of a first clock signal to generate a second signal, and a measurement unit included in the die to sample the first signal based on timing of a second clock signal to provide information for generation of a graph to present an eye scan of the first signal, the second clock signal has a frequency asynchronous with the frequency of the first clock signal.

In Example 18, the subject matter of Example 17 may optionally include, wherein the receiver includes a clock generator to generate the second clock signal, such that the second clock signal has a frequency less than a frequency of the first clock signal.

In Example 19, the subject matter of Example 17 or 18 may optionally include, further comprising a die, wherein the measurement unit includes a synthesizer to generate the graph having sampling points at coordinates based on the information.

In Example 20, the subject matter of Example 17 or 18 may optionally include, wherein the measurement unit includes a time-to-digital converter arranged to generate time code values based on a timing difference between the rising edges of the second signal and a third clock signal generated based on the first clock signal, the time code values are included in the information and are associated with positions on an axis of the graph.

Example 21 includes subject matter (such as a method of operating a device, an electronic apparatus (e.g., circuit, electronic system, or both), or a machine) including collecting information, the information including amplitude values and time code values associated with sampling points from sampling of a signal, determining a highest time code value among the time code values, determining an equivalent time code values for one unit interval, aligning the time codes values to the time code values for one unit interval, and generating a graph that represents an eye scan of the signal associated with the sampling points.

In Example 22, the subject matter of Example 21 may optionally include, wherein the signal is from an output of an equalizer.

In Example 23, the subject matter of Example 21 or 22 may optionally include, wherein sampling of the signal is performed by a measurement unit included in a same die with the equalizer.

In Example 24, the subject matter of Example 21 or 22 may optionally include, wherein the equalizer is included in a receiver, the receiver including a sampler to receive the signal and generate an additional signal at a frequency higher than a sampling frequency used in the sampling of the signal.

In Example 25, the subject matter of Example 21 or 22 may optionally include, wherein aligning the time code values includes aligning fewer than all of the time code values to a unit interval associated with the signal.

Example 26 includes subject matter (such as a device, an electronic apparatus (e.g., circuit, electronic system, or both), or machine) including means for performing any of the methods described herein.

The subject matter of Example 1 through Example 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a receiver unit included in a die, the receiver including a sampler to sample a first signal based on timing of a first clock signal to generate a second signal; and
   a measurement unit included in the die to sample the first signal based on timing of a second clock signal to provide information for generation of a graph presenting an eye scan of the first signal, wherein the second clock signal has a frequency asynchronous with a frequency of the first clock signal, and the information comprises time code values associated with positions on the graph.

2. The apparatus of claim 1, wherein the frequency of the second clock signal is less than the frequency of the first clock signal.

3. The apparatus of claim 1, wherein the time code values are associated with positions on a horizontal axis of the graph.

4. The apparatus of claim 3, wherein the measurement unit is arranged to align fewer than all of the time code values to one unit interval associated with the signal.

5. The apparatus of claim 3, wherein the measurement unit is arranged to generate the time code values based on a timing relationship between the second clock signal and an additional clock signal generated based on the first clock signal.

6. The apparatus of claim 1, wherein the information includes amplitude values associated with positions on a vertical axis of the graph.

7. The apparatus of claim 1, wherein the measurement unit includes a clock generator to generate the second clock signal independent of the first clock signal.

8. An apparatus comprising:
   a first sampler to receive a first signal and generate a second signal based on timing of a first clock signal;
   a divider to generate a second clock signal from the first clock signal;
   a second sampler to sample the first signal at sampling points based on timing of a third clock signal asynchronous with the second clock signal and provide information associated with amplitude values of the sampling points;
   a converter to generate time code values associated with the sampling points based on a timing relationship between the second and third clock signals; and
   a memory to store the amplitude values and the time code values.

9. The apparatus of claim 8, wherein the first and second samplers are included in a receiver.

10. The apparatus of claim 8, further comprising an equalizer to generate the first signal.

11. The apparatus of claim 8, further comprising:
    a clock and data recovery circuit to adjust the timing of the first clock signal; and
    a clock generator to generate the third clock signal.

12. The apparatus of claim 8, wherein the converter includes a time-to-digital converter to generate the time code values based on a timing difference between the second and third clock signals.

13. The apparatus of claim 8, further comprising a synthesizer to generate a graph of the sampling points based on the amplitude values and the time code values.

14. The apparatus of claim 13, wherein the synthesizer is arranged to generate the graph from fewer than all of the sampling points.

15. The apparatus of claim 8, wherein the second sampler is arranged to sample the first signal, such that a maximum of one sampling point is sampled within one period of the second clock signal.

16. The apparatus of claim 8, wherein the second sampler is arranged to sample the first signal, such that a maximum of one sampling point is sampled within multiple periods of the second clock signal.

17. An apparatus comprising:
    conductive lines on a circuit board; and
    a receiver to receive signals from the conductive lines, the receiver including:
       a receiver unit included in a die, the receiver including a sampler to sample a first signal based on timing of a first clock signal to generate a second signal; and
       a measurement unit included in the die to sample the first signal based on timing of a second clock signal to provide information for generation of a graph to present an eye scan of the first signal, wherein the second clock signal has a frequency asynchronous with the frequency of the first clock signal, and the information comprises time code values associated with positions on the graph.

18. The apparatus of claim 17, wherein the receiver includes a clock generator to generate the second clock signal, such that the second clock signal has a frequency less than a frequency of the first clock signal.

19. The apparatus of claim 17, wherein the measurement unit includes a synthesizer to generate the graph having sampling points at coordinates based on the information.

20. The apparatus of claim 17, wherein the measurement unit includes a time-to-digital converter arranged to generate the time code values based on a timing difference between the rising edges of the second signal and a third clock signal generated based on the first clock signal, the time code values are included in the information and are associated with positions on an axis of the graph.

* * * * *